United States Patent
Khare

(10) Patent No.: US 10,447,253 B2
(45) Date of Patent: Oct. 15, 2019

(54) HIGH PERFORMANCE PLL BASED ON PVT INDEPENDENT STABLE OSCILLATOR

(71) Applicant: MegaChips Corporation, Osaka (JP)

(72) Inventor: Abhishek Kumar Khare, Karnataka (IN)

(73) Assignee: MegaChips Corporation, Osaka (JP)

( * ) Notice: Subject to any disclaimer, the term of this patent is extended or adjusted under 35 U.S.C. 154(b) by 175 days.

(21) Appl. No.: 15/840,163

(22) Filed: Dec. 13, 2017

(65) Prior Publication Data

US 2019/0181845 A1  Jun. 13, 2019

(51) Int. Cl.
| | |
|---|---|
| H03K 5/1252 | (2006.01) |
| H03L 7/10 | (2006.01) |
| H03K 3/011 | (2006.01) |
| H03L 7/099 | (2006.01) |
| H03L 7/093 | (2006.01) |
| H03K 3/03 | (2006.01) |

(52) U.S. Cl.
CPC ............ *H03K 5/1252* (2013.01); *H03K 3/011* (2013.01); *H03L 7/0995* (2013.01); *H03L 7/104* (2013.01); *H03K 3/0315* (2013.01); *H03L 7/093* (2013.01)

(58) Field of Classification Search
CPC .... H03K 5/011; H03K 5/1252; H03K 5/0315; H03L 7/104; H03L 7/0995; H03L 7/093
See application file for complete search history.

(56) References Cited

U.S. PATENT DOCUMENTS

| | | | |
|---|---|---|---|
| 6,806,786 B1 * | 10/2004 | Lam | H03L 7/10 327/147 |
| 7,907,027 B2 | 3/2011 | Partridge et al. | |
| 7,986,175 B2 | 7/2011 | Ebuchi et al. | |
| 2003/0224749 A1 * | 12/2003 | Uozumi | H03F 1/0211 455/252.1 |
| 2008/0061889 A1 | 3/2008 | Matsumoto et al. | |
| 2009/0167443 A1 | 7/2009 | Liu et al. | |
| 2012/0242415 A1 * | 9/2012 | Tsuda | H03L 7/089 331/27 |
| 2013/0076450 A1 | 3/2013 | Rao et al. | |

* cited by examiner

*Primary Examiner* — Jeffrey M Shin
(74) *Attorney, Agent, or Firm* — Osha Liang LLP

(57) ABSTRACT

A high performance phase-locked loop, the device includes a phase frequency detector, a charge pump, a loop filter, a first oscillator having inverters, configured to generate a first current, a second oscillator having a scaled version of the inverters of the first oscillator, a digital to analog converter, configured to generate a second current by multiplying the first current and a frequency code, a voltage to current converter, configured to generate a third current by converting voltage output of the loop filter to current, wherein input current to the second oscillator is sum of the second current and the third current.

20 Claims, 7 Drawing Sheets

PLL Conceptual Block Diagram

HSOSC - Highly Stable Ring Oscillator (Known Art)

PLL Conceptual Block Diagram

Current DAC

Basic Flowchart for Frequency Calibration

Loop Filter

Current Controlled Oscillator

Frequency Calibration Block

HIGH PERFORMANCE PLL BASED ON PVT INDEPENDENT STABLE OSCILLATOR

FIELD OF THE INVENTION

The present disclosure relates to a high performance phase locked loop (PLL) with faster lock time and more particularly to a PLL having a current controlled oscillator (CCO) which is scaled replica of a PVT independent highly stable ring oscillator

BACKGROUND OF THE INVENTION

Phase locked loop (PLL) is a control system, widely used in telecommunication, computers and other digital electronics application. Performance of a PLL is decided on several factors including faster lock times, low jitters, wide range of output frequency, low frequency variation due to variations in device parameters (particularly temperature, voltage and process—PVT), low power consumption and area etc.

Several PLL architectures have been suggested for improving the performance of a PLL particularly for achieving faster lock times and reducing deterministic jitter. While these conventional PLL had improved performance, however, achieving of very fast lock times and reducing deterministic jitter was not achievable by them. Particularly, a conventional PLL do not achieve a PLL lock time of less than 100 μs and deterministic jitter less than 0.15 UI, while operating at supply voltage range of 0.98 V to 1.21 V, temperature range of −40° C. to 125° C., input frequency range of PLL: 135 MHz to 270 MHz and output frequency range of PLL: 1.35 GHz to 2.7 GHz.

U.S. Pat. No. 7,986,175 and US2008/0061889 disclose utilizing VCO gain and frequency comparison to obtain phase locking. However, their mechanism is complex and lock time is long. Further, PLL of these arts consume a lot of power and area, which is not desirable in several digital electronic circuitries.

US2013/0076450 discloses a low noise bias circuit for a PLL oscillator which rely on an LC VCO to achieve wide frequency range coverage. However, LC VCO is not suitable for several applications as the same a lot of power and area. Further, the VCO of the PLL as per this art requires higher gain, which leads to high deterministic jitter, thereby affecting the performance of the PLL.

US 2009/0167443 provides a digitally compensated highly stable holdover clock generation technique, using external OCXO and EEPROM along with Digital Loop filter to achieve stable frequency. However, it requires an off-chip stable oscillators to provide stable frequency source which lead to complex circuit and more power consumption and area.

Another problem with the conventional PLL like LC VCO is that there is only one centre frequency and such PLL cannot be utilized in the application requiring several centre frequencies. Further, the conventional PLL, due to PVT variation of their VCO, do not provide very fast lock times for the PLL.

In view of the foregoing, there is a requirement of high performance phase locked loop (PLL) with faster lock time of less than 100 μs for allowing fast wake up as well as high operating frequency along with several centre frequencies. Also, it is desirable that deterministic jitters are low for the PLL.

SUMMARY

The present disclosure provides a device and a method for fast locking phase-locked loop producing low jitter which is based on PVT independent stable oscillator. Existing phase-locked loop do not provide fast wake up as well as have high output jitter.

One or more embodiments of the present disclosure provides a phase-locked loop which includes a phase frequency detector, a charge pump, a loop filter, a first oscillator having inverters, configured to generate a first current, a second oscillator having a scaled version of the inverters of the first oscillator, a digital to analog converter, configured to generate a second current by multiplying the first current and a frequency code, a voltage to current converter, configured to generate a third current by converting voltage output of the loop filter to current, wherein input current to the second oscillator is sum of the second current and the third current.

One or more embodiments of the present disclosure provides a method of training a PLL for generating a frequency code, the method includes, setting the frequency code to a default value, asserting a clamp signal to tri-state a charge pump and a phase frequency detector of the PLL, comparing a reference clock and a feedback clock using a frequency calibration block, wherein the frequency calibration block comprises a comparator and a frequency code generator, updating the frequency code based on the comparison of the reference clock and the feedback clock, wherein the updation of the frequency code is performed till the difference between reference clock and the feedback clock is above a specified value, locking and storing the frequency code once the difference between reference clock and the feedback clock is below the specified value, and de-asserting the clamp signal to switch the charge pump and the phase frequency detector in a normal working mode.

One or more embodiments of the present disclosure provides a fast locking phase-locked loop producing low jitter, the device includes a phase frequency detector, a charge pump, a loop filter, a first oscillator having odd number of inverters, configured as a low frequency open loop oscillator to generate the first current which is stable across process, voltage and temperature variation, a second oscillator having a scaled version of the inverters of the first oscillator, configured as a closed loop current controlled high frequency oscillator to generate the output frequency of the PLL, a frequency calibration block, configured to generate a frequency code by comparing a reference clock frequency and a feedback clock frequency, a digital to analog converter, configured to generate a second current by multiplying the first current and the frequency code, a voltage to current converter, configured to generate a third current by converting voltage output of the loop filter to current, wherein input current to the second oscillator is sum of the second current and the third current, wherein the frequency code is generated and stored during a training mode prior to the normal mode of the PLL, wherein the voltage output of the loop filter is clamped to a clamp voltage during the training mode.

These as well as other aspects and advantages of the present disclosure will become more apparent to those of ordinary skill in the art by reading the following detailed description, with reference to the accompanying drawings.

BRIEF DESCRIPTION OF THE DRAWINGS

The accompanying drawings constitute a part of the description and are used to provide further understanding of the present disclosure. Such accompanying drawings illustrate the embodiments of the present disclosure which are used to describe the principles of the present disclosure together with the description.

DETAILED DESCRIPTION OF THE INVENTION

The present disclosure relates to a high performance phase locked loop (PLL) with faster lock time and low jitter. In the embodiments defined hereinafter, the PLL utilizes a highly stable ring oscillator (HSOSC) designed on CMOS bulk technology which has very less frequency variation across PVT. However, the invention is not limited to the oscillator or the bulk CMOS technology and the PLL could be implemented using any other oscillator stable across PVT or could be equally applied to any other integrated circuit technologies respectively.

A low jitter PLL requires KVCO of the oscillator of the PLL to be low. KVCO refers to the frequency to voltage gain of the oscillator of the PLL. Particularly, higher KVCO leads to higher jitter since any noise at the input is multiplied by KVCO factor before being output. However, high KVCO is still needed since a ring VCO/CCO of the PLL suffers from high frequency variation across PVT and high KVCO will ensure wide frequency coverage to compensate for frequency variation. On the other hand, if the frequency of the oscillator (VCO/CCO of the PLL) is stable across PVT, KVCO can be kept low, hence improving the PLL jitter performance.

Figure 1:
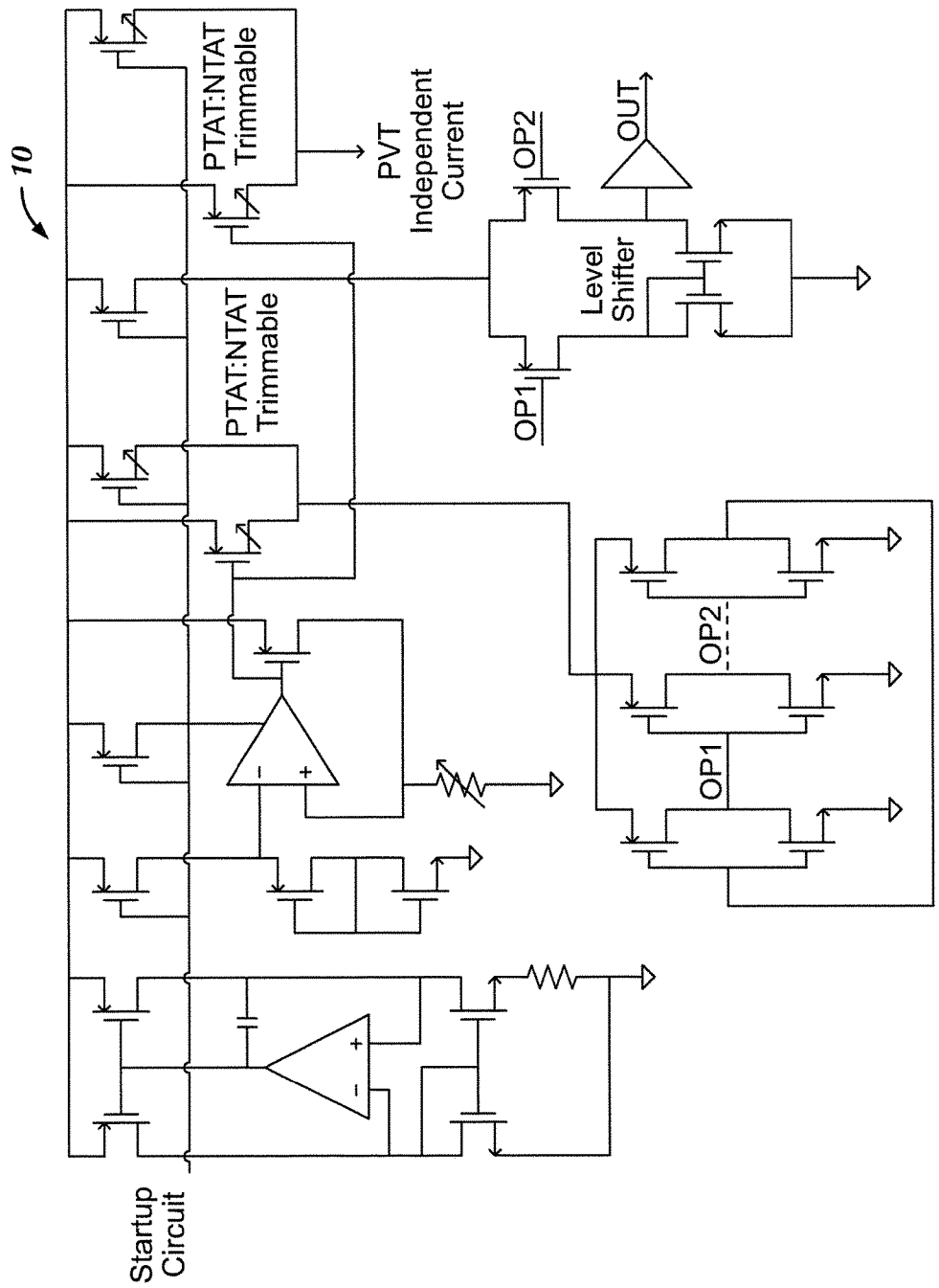
FIG. 1 shows a highly stable ring oscillator circuit known in the art.

FIG. 1 is a known Highly Stable Ring Oscillator (HSOSC) 10 described in the Indian Patent Application Number 201611011147 filed on Mar. 30, 2016 of the same inventor as of the present application. The HSOSC 10 shown in FIG. 1 has an operating frequency of 135 MHz and is designed in 40 nm CMOS bulk technology. The HSOSC 10 achieves less than (±2%) frequency variation across PVT as described in the said patent application document.

Figure 2:
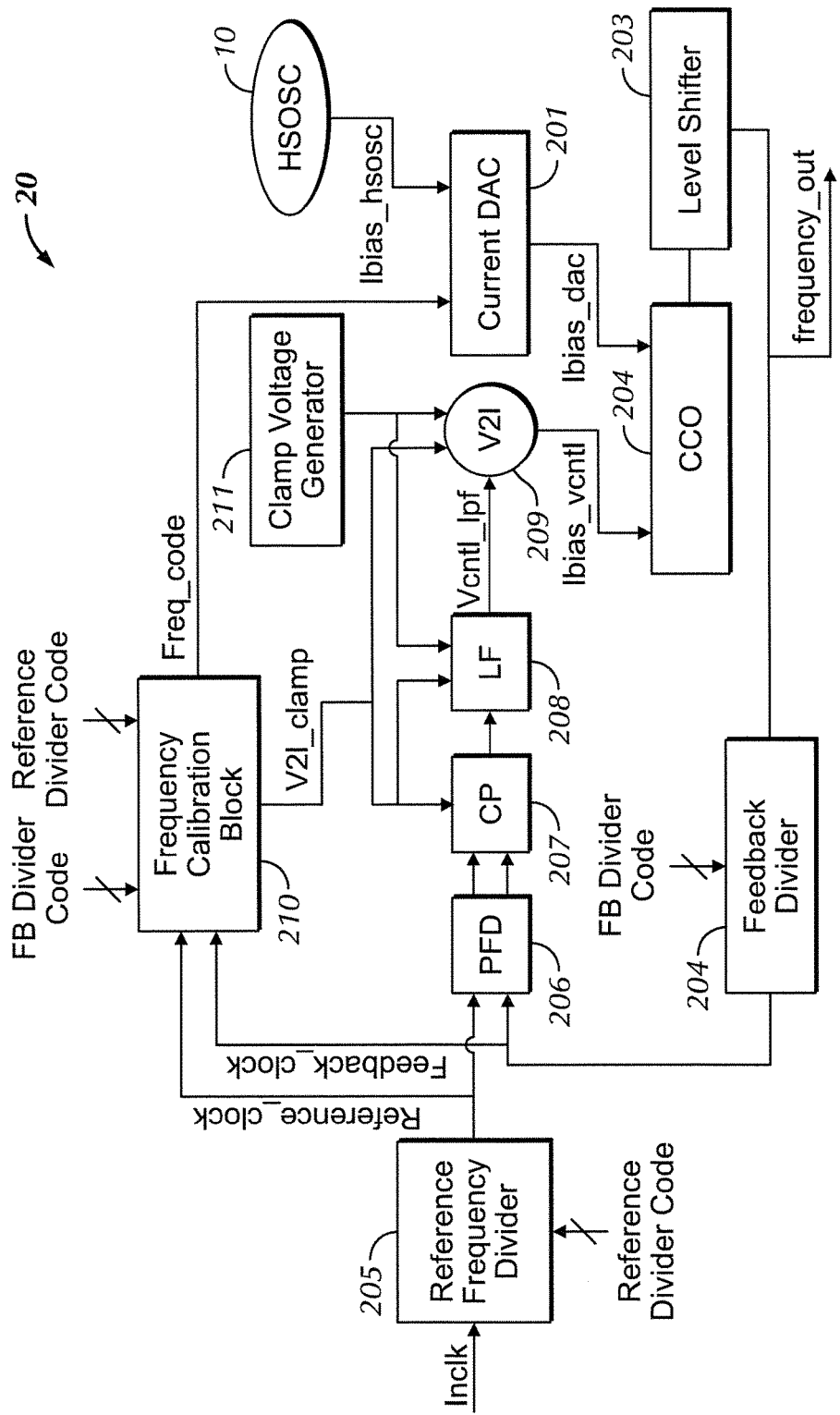
FIG. 2 illustrates functional block diagram of PLL in accordance with an embodiment of the present disclosure.

FIG. 2 is a functional block diagram of the high performance PLL 20 in accordance with an embodiment of the present disclosure. The PLL consists of the HSOSC 10, a current DAC 201, a Current Controlled Oscillator (CCO) 202, a level shifter 203, a feedback divider 204, a reference frequency divider 205, a PFD 206, a CP 207, a LPF 208, a V2I 209, a frequency calibration block 210 and a clamp voltage generator 211.

Figure 8:
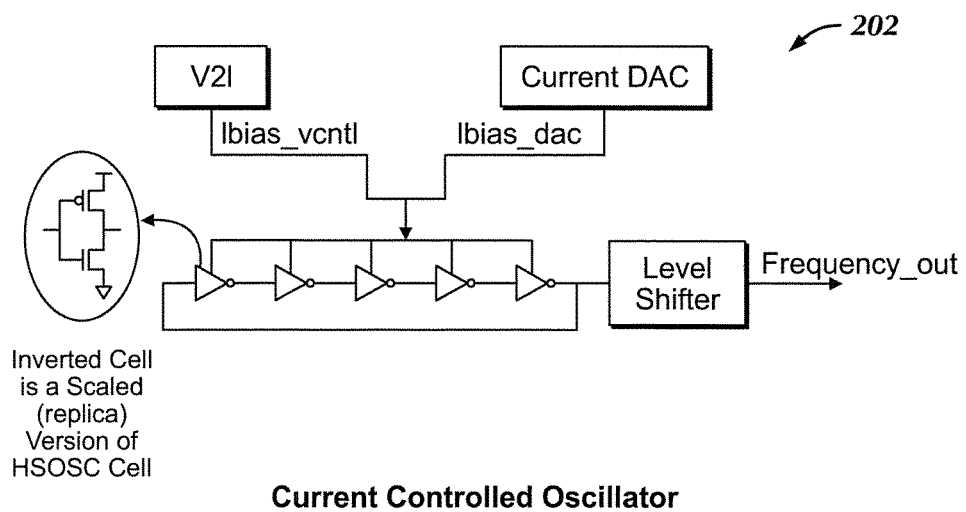
FIG. 8 illustrates the current controlled oscillator in accordance with an embodiment of the present disclosure.

As per an embodiment of present disclosure, the CCO 202 is a scaled replica version of the HSOSC 10 of FIG. 1. The scaled replica version represents that current controlled ring delay cells in CCO 202 are replica of the delay cells used in the HSOSC 10 ring. Also, the bias current into the CCO 202 is a multiplied version of the current biasing the HSOSC 10 ring. Particularly, the delay cells of CCO 202 are inverters, wherein the PMOS and NMOS sizing in each inverter is multiple of the sizing used in the inverter of the HSOSC 10. The CCO 202 has currents inputs Ibias_vcntl and Ibias_dac from the V2I 209 and current DAC 201 respectively. A detailed circuit for CCO 202 is also shown in FIG. 8, in which the CCO 202 is composed of a ring oscillator using a replica cell. The current for the ring oscillator in FIG. 8 is provided from the Current DAC and from the V2I.

FIG. 2 further shows the level shifter 203 at the output of the CCO 202. With the help of the level shifter 203, output frequency is level shifted to core supply at the output of the oscillator. The operation of the level shifter described here is trivial and the invention is not limited by the circuit or use thereof.

FIG. 2 further shows the feedback divider 204 and the reference frequency divider 205. The said divider is usual programmable digital dividers which achieve frequency division. The feedback divider 204 and a reference frequency divider 205, have the inputs as FB divider code and Ref divider code respectively on the basis of which the factor of frequency division is applied. The reference frequency divider 205 may or may not be used (it has a bypass option, divide by /1) depending on the input frequency range to be supported for a given application. If the PFD 206 can support the input frequency range directly then, the reference frequency divider 205 is used in the /1 mode (bypass). Else, the same may be programmed to /2, /4, /8 mode and accordingly decide the feedback divider 204 to obtain the right VCO and PLL output frequency.

FIG. 2 further shows the PFD (Phase Frequency Detector) 206. PFD 206 is a usual three state detector. FIG. 2 further shows the CP (Charge Pump) 207. CP 207 is a usual Charge Pump Circuit described in relevant literature which ensures that charge sharing and charge injection into the control voltage are taken care of.

FIG. 2 further shows the LPF (or loop filter, LF) 208. It is a usual passive loop filter which makes the PLL a type 2, order 3 PLL. It is pertinent of note that the operation of the LPF 208, PFD 206, CP 207, level shifter 203, feedback divider 204 and reference frequency divider 205 described here is trivial and the invention is not limited by the circuit or use thereof.

Figure 3:
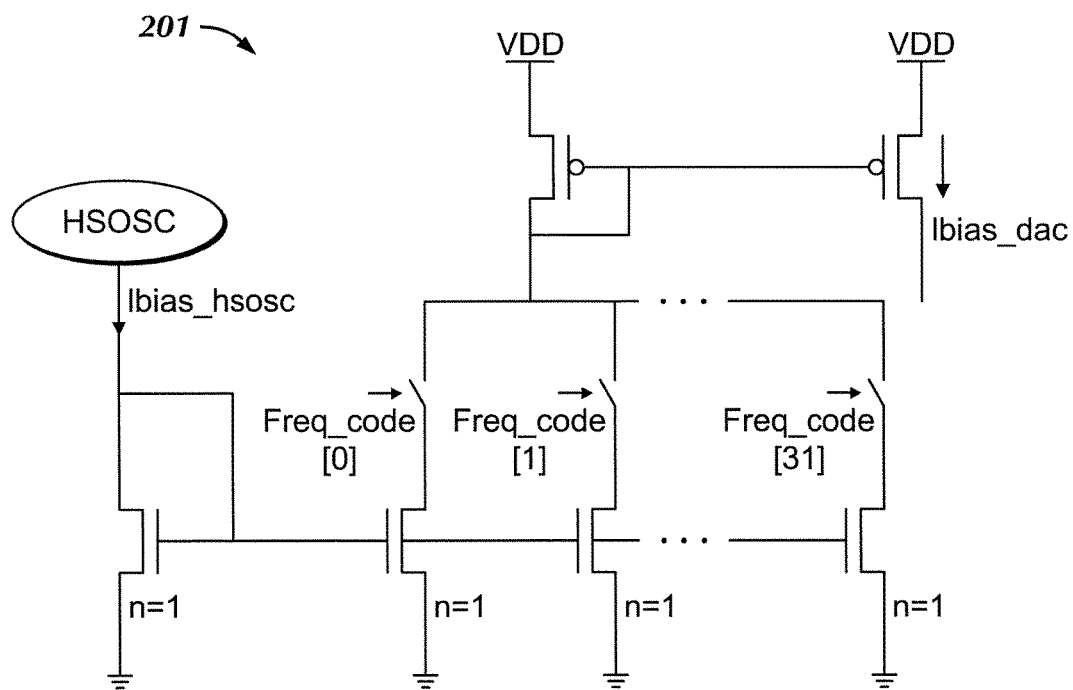
FIG. 3 illustrates a current digital to analog converter circuit.

FIG. 2 further shows the current DAC 201. The current DAC 201 is a digital to analog convertor and is explained in detail in FIG. 3. The input to the current DAC 201 is current from the HSOSC 10 (Ibias_hsosc) and a frequency code from the frequency calibration block 210. For instance, FIG. 3 illustrates a frequency code of 32 bits. The output of the current DAC 201 is the current Ibias_dac which is given by the following equation:

$$Ibias\_dac = Ibias\_hsosc * Freq\_code[31:0] \quad (1)$$

The operation of the current DAC 201 described here is trivial and the invention is not limited by the circuit thereof.

Figure 4:
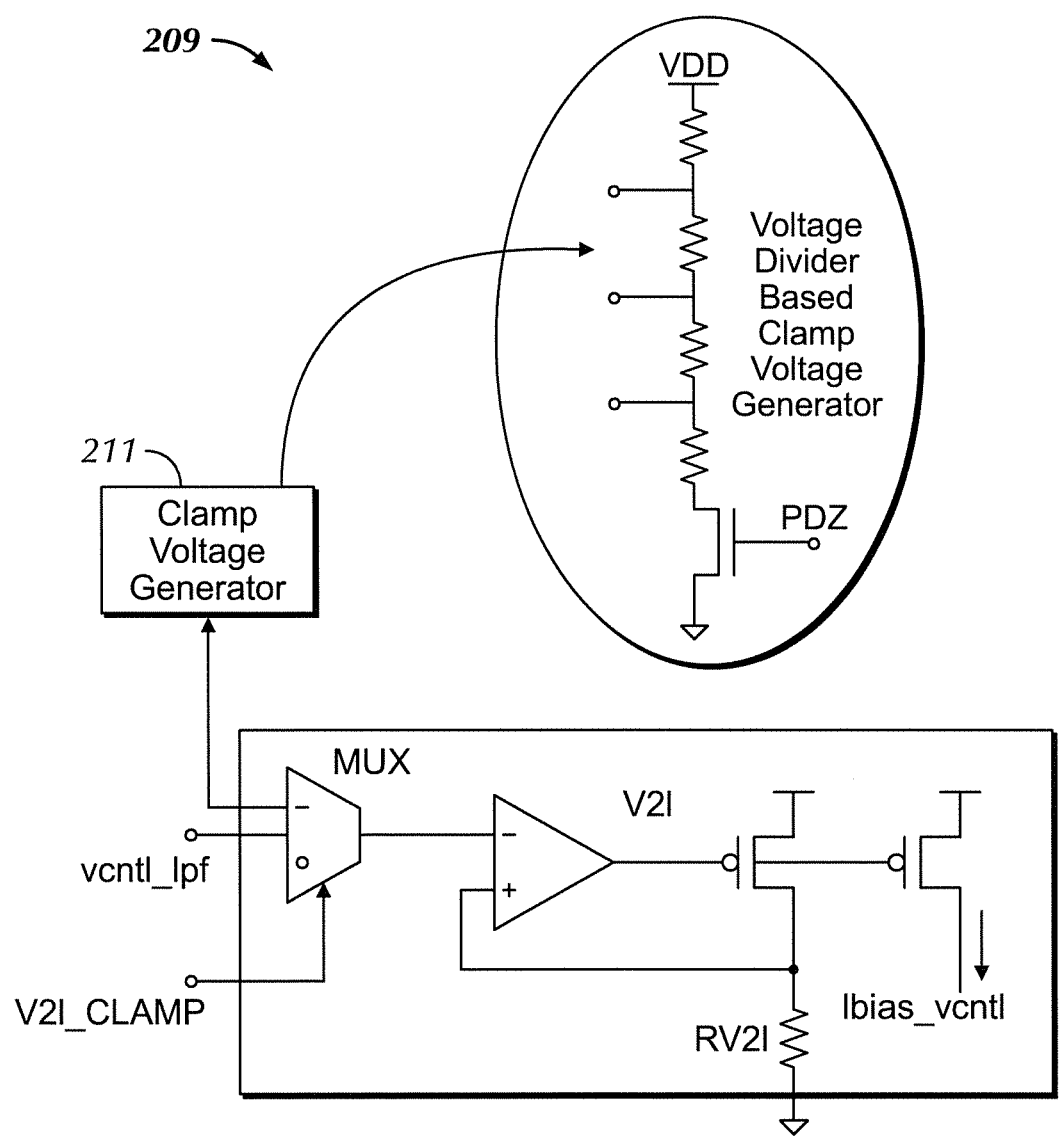
FIG. 4 illustrates a voltage to current converter with clamp voltage generator.

FIG. 2 further shows the V2I 209 which is a normal OTA based voltage to current generator circuit as shown in FIG. 4. The input to the V2I 209 is a voltage Vctrl_lpf and a V2I_clamp from the LPF 208 and the frequency calibration block 210 respectively. The clamp voltage generator 211 is also shown in FIG. 4 which consists of a voltage divider circuit realized using a resistor ladder and generates a clamp voltage. The clamp voltage is chosen by selecting one of the taps from the resistor ladder. Particularly, as shown in FIG. 4, a PDZ signal in clamp voltage generator 211 is a global PDZ signal of PLL and may come from Power ON detect circuitry in the SOC or chip where the PLL is used. The PDZ signal is used as a trigger at power on. The control signals to tap the voltage generator tap are register bits, which may provided by SPI or I2C controlled register bank present in the chip and the invention is not limited by the control signals of the clamp voltage generator 211.

Figure 5:
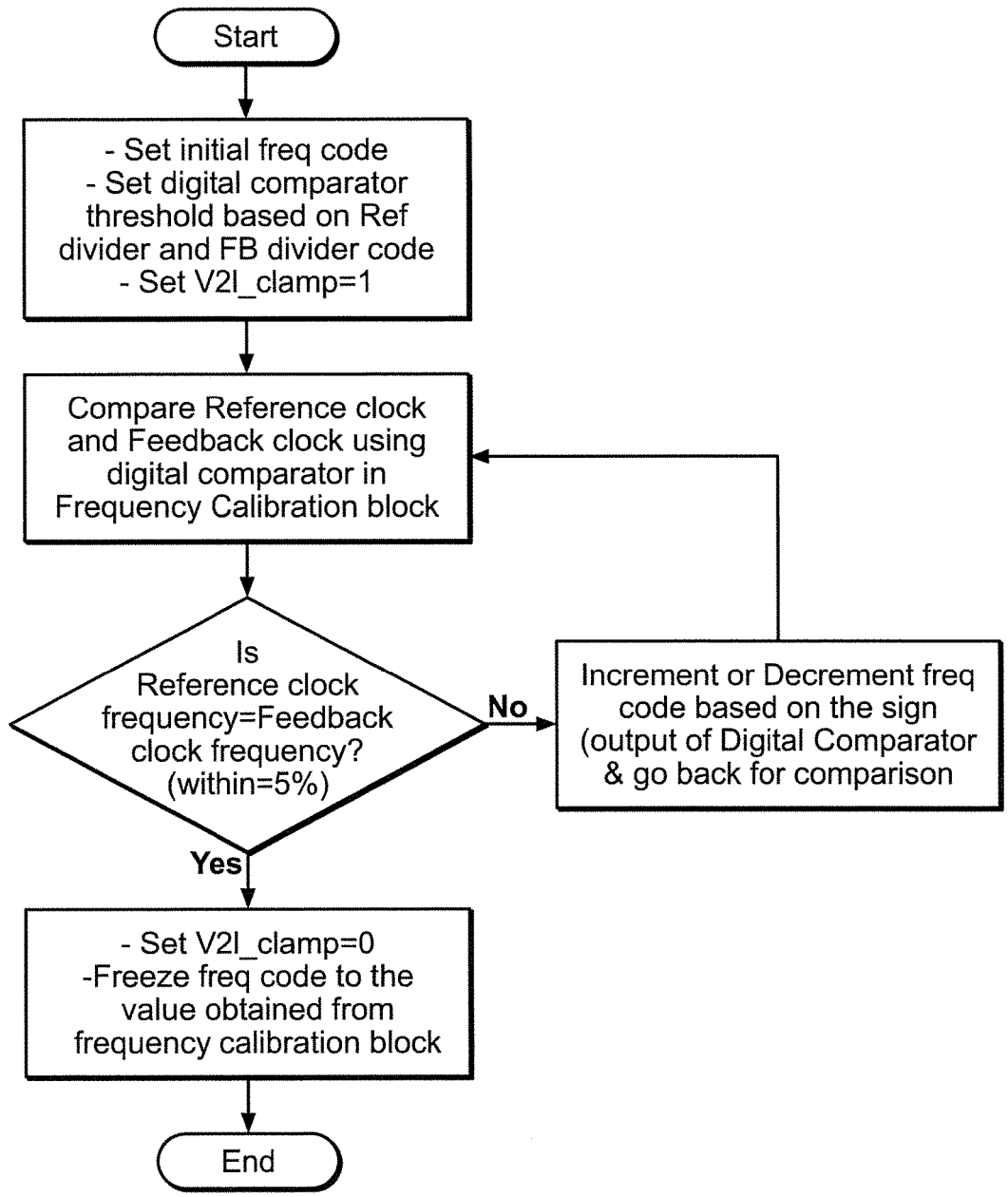
FIG. 5 is a flowchart illustrating a frequency calibration process in accordance with an embodiment of the present disclosure.
Figure 6:
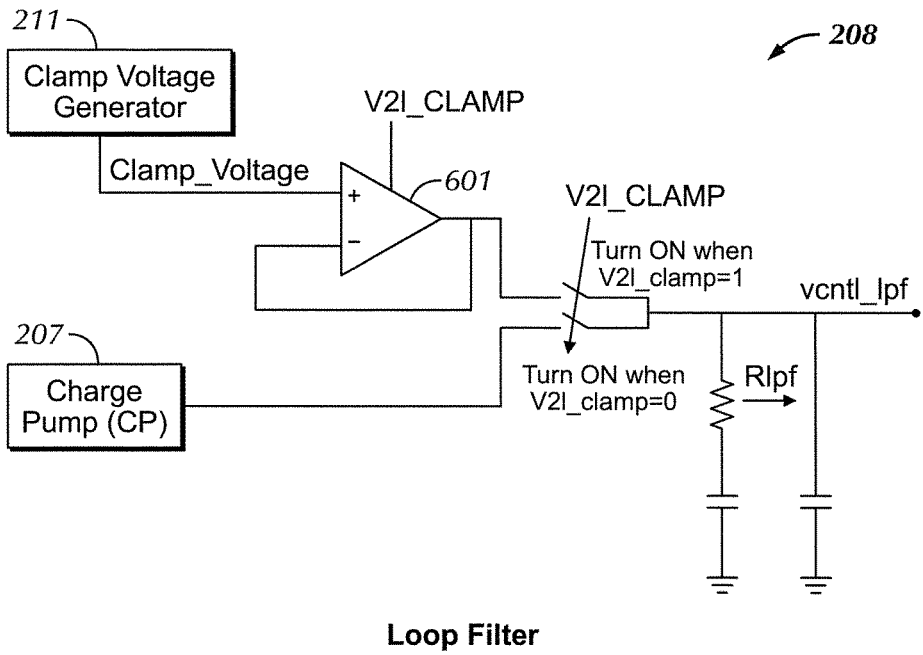
FIG. 6 illustrates loop filter circuit.

FIG. 2 further shows the frequency calibration block 210. The working of the invention and the frequency calibration block 210 is explained in detail hereinafter. At the state of initial start-up, i.e. when a stable supply voltage is provided to the PLL, the PLL enters a frequency calibration mode (or training mode). FIG. 5 illustrates the frequency calibration mode by way of a flowchart. At the beginning of the frequency calibration mode, an initial frequency code is applied to the current DAC 201. This initial frequency code may be fixed to a mid value. Also, the V2I_clamp is kept HIGH at this stage which allows the CP 207 to remain in a tri-state, i.e. CP 207 output to LPF 208 remains off. As shown in FIG. 6, if V2I_clamp is '1' (HIGH), the CP 207 is disconnected from the LPF 208. Further as shown in FIG. 6, when V2I_clamp is '1' (HIGH), the output of LPF 208 Vcntl_lpf is charged to the voltage of the clamp voltage generator 211 since the amplifier 601 is in the turned ON state with a unity gain. This ensures that the LPF 208 is charged to the clamp voltage in Frequency calibration mode itself and no further charging time is required later on in the normal working mode of the PLL. Further as shown in FIG. 4, when V2I_clamp is '1', the output of the V2I 209, i.e. Ibias_vcntl, remains fixed corresponding to the clamp voltage.

Figure 7:
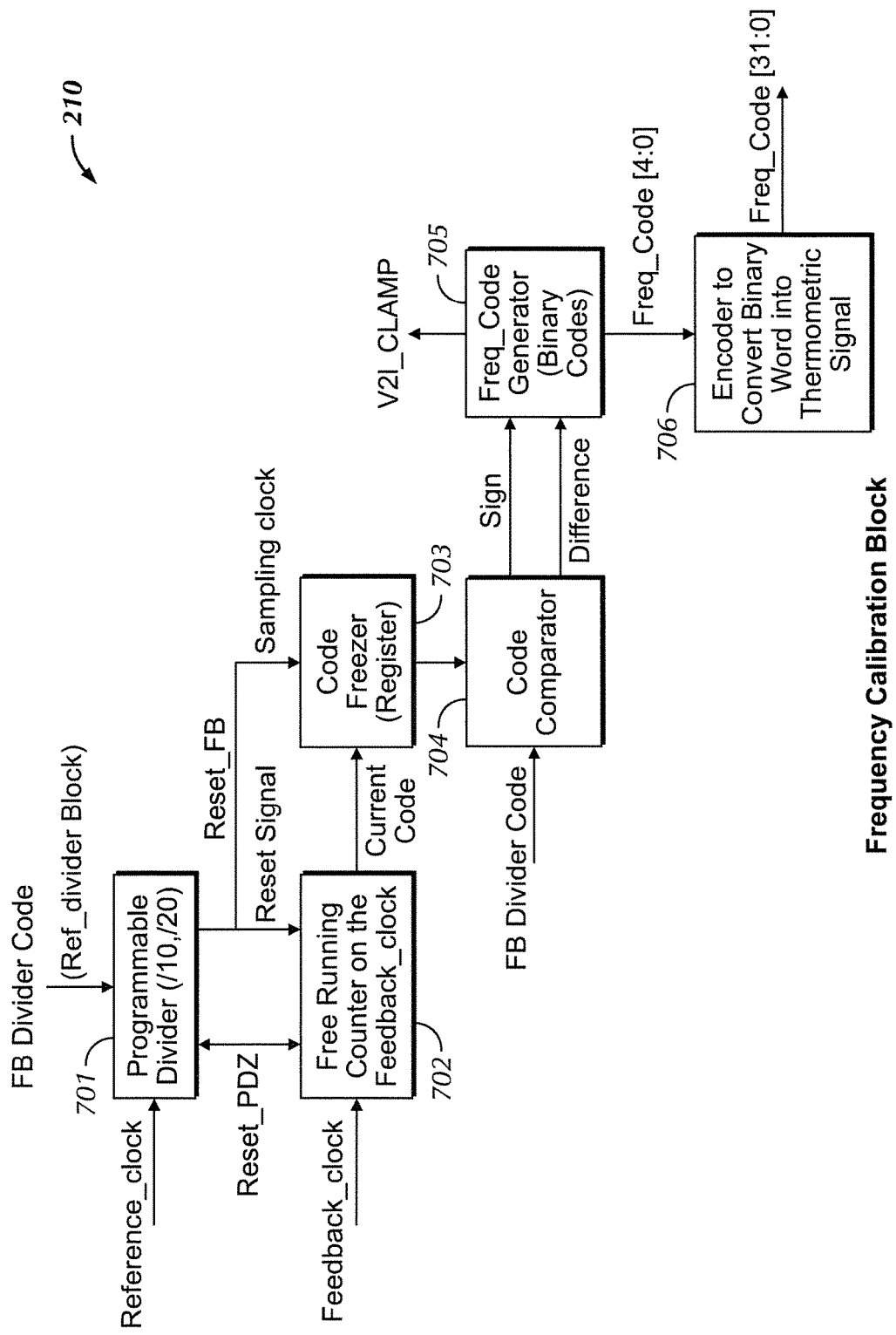
FIG. 7 illustrates functional block diagram of the frequency calibration block in accordance with an embodiment of the present disclosure.

FIG. 7 shows the frequency calibration block 210 in detail. Frequency calibration block 210 has input as the reference clock and feedback clock as shown in FIG. 2 and FIG. 7. Frequency calibration block 210 has a REF_Divider block 701, which is a programmable divider and divides the reference clock by a factor of FB divider code to generate an output RESET_FB. For example, if reference clock is 1000 and FB divider code is 20, then the RESET_FB will be 50 (i.e. 1000/20). The frequency calibration block 210 further has a free running counter 702 with input as feedback clock and a reset input as the RESET_FB.

The frequency calibration mode illustrated in flowchart of FIG. 5 is explained as follows. Initially, when the power is switched on, a RESET PDZ signal resets the REF_Divider block 701 and free running counter 702. The RESET PDZ signal is same as the PDZ signal in clamp voltage generator 211 and both are triggered at the same time. After this initial resetting, the free running counter 702 counts on the feedback clock and on the RESET_FB, the counter value is stored in a code freeze register 703 as shown in FIG. 7 while the REF_Divider block 701 and the free running counter 702 are reset on the RESET_FB. The value stored in the code freeze register 703 is compared with FB divider code by a code comparator 704, which generates a sign (+ve or −ve) and a difference value between the code in the code freeze register 703 and FB divider code. The code comparator 704 generates a +ve sign if the code in the code freeze register 703 is less than the FB divider code. The code comparator 704 generates a −ve sign if the code in the code freeze register 703 is greater than the FB divider code.

As shown in FIG. 7, the sign and the difference value are inputted to a Freq_code generator 705 which generates a Freq_code as output. On the basis of the difference value, the Freq_code generator 705, decides as follows:

In case the difference value is ≥2 and the sign is +ve, then the Freq_code is incremented.

In case the difference value is ≥2 and the sign is −ve, then the Freq_code is decremented.

In case the difference value is <2, the frequency calibration mode is finished, the Freq_code is locked (and stored) and voltage V2I_clamp is set low i.e. the frequency calibration mode is over and PLL enters the normal mode. The difference value of '2' has been selected to achieve the feedback frequency to be within ±5% of the input reference frequency and the invention is no way limited to the difference value criterion. Further, the increment/decrement of the Freq_code is programmable and can be selected as 1, 2 or 4 etc. As shown in FIG. 7, the V2I_clamp is generated by Freq_code generator 705 and based on the difference value, V2I_clamp is set low or high. Further, element 706 in FIG. 7 represents an encoder to convert a binary word into a thermometric signal.

Also, during the Frequency calibration mode, the current Ibias_vcntl from the V2I 209 is negligible as compared to the current Ibais_dac, since the V2I_clamp is '1'. Once the calibration mode is over and V2I_clamp is set '0', the voltage Vcntl_lpf is converted to current by the V2I 209 and the current Ibias_vcntl ensures proper frequency and phase locking of the PLL 20.

As explained above and shown in FIG. 2, the invention provides PVT independent bias current to the CCO 202 by using the HSOSC 10 (low frequency open loop stable oscillator). As the HSOSC 10 output is PVT independent, the CCO 202 frequency is also PVT independent. Therefore, unlike the known architectures of PLL, wherein the bias current (or control voltage) of another CCO (or VCO) which is with in a Master PLL loop is generally used for the slave VCO or CCO, the invention provides usage of bias current derived from an open loop on chip stable ring oscillator (HSOSC 10) which is stable, consumes low power.

Further, as explained above and shown in FIG. 7, the Freq_code generated during the Frequency calibration mode is stored. Accordingly, since the CCO 202 frequency output is highly stable across PVT, the Freq_code stored during the Frequency calibration mode will allow the PLL to achieve locking in very less time. The fast locking of PLL is desirable especially for PSR/PSR2 feature of Display Port/Embedded Display Port standards. Particularly, fast locking of PLL in eDP standards allows saving of system power, an effect particularly desirable for handheld display devices, like mobile phones etc. Typically, the PLL of present disclosure can achieve a faster lock time by a factor of 4 to 5 as compared to a conventional PPL.

Also, since the CCO 202 is based on HSOSC 10, its output is resistant to temperature and voltage variation. Typically, the CCO 202 has less than +5% variation in output frequency across temperature and voltage variation as compared to the traditional CCO having upto ±25% (even ±30%) variation in output frequency. Accordingly, as the output frequency variation of CCO 202 is less and the frequency calibration code enables efficient locking, the KVCO of the CCO 202 can be kept low while meeting a large frequency coverage. Typically, the PLL of the present disclosure allows 5 to 10 factor reduction in KVCO without compromising on the input/output frequency range. For example, for covering a frequency range of 1.35 GHz to 2.7 GHz, in a conventional CCO the KVCO requirement may be 5 GHz/Volt while the same in the PLL of the present disclosure can be reduced to less than 1 GHz/Volt. As explained earlier, lower KVCO is desirable to reduce noise and improve PLL's jitter performance. Typically, the PLL of present disclosure can achieve up to 0.1 UI reduction in overall deterministic jitter specification.

In another embodiment of the present disclosure, the frequency calibration mode may not be required each time. Particularly, for applications having input and output frequency known, the frequency calibration can be performed once and the frequency code can be applied directly to the current DAC 201. In such cases, frequency calibration mode is not required; accordingly the V2I_clamp signal is bypassed and the PLL directly works in the normal mode with CP 207, PFD 206 and LPF 208 in working mode with a stored frequency code applied to the current DAC 201. A special signal, say fast wakeup may be required in such cases to bypass the V2I_clamp signal (hence bypass the frequency calibration mode) and start the PLL directly in the normal mode.

In another embodiment of the present disclosure, the PVT independent current generated in the HSOSC 10 can be used as the CP 207 bias current. Accordingly, the CP 207 current becomes independent of the PVT variation. Also, TRIM CODE of the HSOSC 10 (as defined in the patent specification of HSOSC) can also be decoded and used to control the resistor in the LPF 208. Accordingly, the LPF 208 resistor value will be independent of the process variation. The combination of PVT independent charge pump current and resistor calibrated LPF 208 resistor along with PVT independent CCO 202, will in turn make the PLL Loop Bandwidth independent of PVT. Typically, loop Bandwidth of the PLL of the present disclosure will vary less than <±10% across PVT.

In another embodiment of the present disclosure, the LPF 208 resistor, labelled as Rlpf as shown in FIG. 6. The value of this resistor is decided based on PLL loop phase margin and bandwidth requirements and depends on other PLL loop components as well. For example, suppose we want it to be 10K across PVT. Since in the HSOSC 10 we have used RPPOLY resistor bank which is trim able, we already know the TRIM code used to achieve stable frequency in HSOSC 10. This TRIM CODE is an indicator of the process variation in RPPOLY resistor. Since Rlpf also as RPPOLY resistor, these TRIM CODE from HSOSC 10 can be used to add or remove some segments of resistors from Rlpf to ensure that the Rlpf is constant across Process variation.

Accordingly, the PLL of present disclosure, with its stable CCO 202 and frequency calibration mode, provides faster lock time and low deterministic jitter (DJ). A typical PLL implemented with the architecture described with the present disclosure achieves PLL Lock time <100 us, PLL DJ<0.15 UI over supply voltage range: 0.98V to 1.21V, temperature range: −40 C to 125 C, variation of HSOSC 10 frequency: <(+/−)2% across PVT, target Frequency (HSOSC): 135 MHz, input frequency range of PLL: 135 MHz to 270 MHz and output frequency range of PLL: 1.35 GHz to 2.7 GHz.

The invention should not be regarded as being limited to the embodiments described in above rather various modifications and combinations may be carried out without departing from the spirit of the invention. The invention should not be regarded as being limited to the embodiments described in above or to the modifications suggested above but various modifications and combinations may be carried out without departing from the scope of the following claims.

The invention claimed is:

1. A phase-locked loop comprising:
   a phase frequency detector, a charge pump, a loop filter,
   a first oscillator comprising inverters, configured to generate a first current,
   a second oscillator comprising a scaled version of the inverters of the first oscillator,
   a digital to analog converter, configured to generate a second current by multiplying the first current and a frequency code,
   a voltage to current converter, configured to generate a third current by converting voltage output of the loop filter to current,
   wherein input current to the second oscillator is sum of the second current and the third current.

2. The phase-locked loop of claim 1, wherein the frequency code is generated and stored during a training mode prior to the normal mode of the PLL, and wherein the voltage output of the loop filter is clamped during the training mode.

3. The phase-locked loop of claim 1, wherein the second oscillator is configured as a closed loop oscillator to generate the output frequency of the PLL.

4. The phase-locked loop of claim 1, wherein the frequency code is generated by comparing a reference clock frequency and a feedback clock frequency.

5. The phase-locked loop of claim 2, wherein the frequency code is generated by a frequency calibration block.

6. The phase-locked loop of claim 5, wherein the frequency calibration block is programmable to generate the frequency code corresponding to a factor of difference between the reference clock frequency and the feedback clock frequency.

7. The phase-locked loop of claim 5, wherein the frequency calibration block comprises a feedback divider code, a programmable divider, a free running counter, a code freeze register, a code comparator and a frequency code generator.

8. The phase-locked loop of claim 7, wherein the programmable divider generates a reset feedback pulse by dividing the reference clock frequency with feedback divider code, and
   wherein the free running counter samples the feedback clock frequency based on the reset feedback and stores the generated code in the code freeze register.

9. The phase-locked loop of claim 8, wherein the code comparator generates a difference and a sign value based on comparison of the code in the code freeze register and the feedback divider code.

10. The phase-locked loop of claim 9, wherein the frequency code generator generates the frequency code based on the difference and the sign value generated by the code comparator.

11. The phase-locked loop of claim 10, wherein the training mode ends when the difference value becomes less than a specific value.

12. The phase-locked loop of claim 1, further comprising a level shifter connected to the output of the second oscillator.

13. The phase-locked loop of claim 2, wherein the training mode or the normal mode is selected based on a signal.

14. The phase-locked loop of claim 2, wherein the voltage output of the loop filter is clamped to a clamp voltage of a clamp voltage generator during the training mode.

15. The phase-locked loop of claim 2, wherein the phase frequency detector and the charge pump are tri-stated during the training mode.

16. A method of training a PLL for generating a frequency code comprising:
   setting the frequency code to a default value;
   asserting a clamp signal to tri-state a charge pump and a phase frequency detector of the PLL, comparing a reference clock and a feedback clock using a frequency calibration block, wherein the frequency calibration block comprises a comparator and a frequency code generator, updating the frequency code based on the comparison of the reference clock and the feedback clock, wherein the updation of the frequency code is performed till the difference between reference clock and the feedback clock is above a specified value, locking and storing the frequency code once the difference between reference clock and the feedback clock is below the specified value, and de-asserting the clamp signal to switch the charge pump and the phase frequency detector in a normal working mode.

17. The method of claim 16, wherein the comparator generates a difference and a sign value.

18. The method of claim 17, wherein the frequency code generator performs the updation on the basis of the difference and the sign value.

19. The method of claim 16, wherein the specified value is programmable.

20. A fast locking phase-locked loop producing low jitter comprising:

a phase frequency detector, a charge pump, a loop filter, a first oscillator comprising odd number of inverters, configured as a low frequency open loop oscillator to generate the first current which is stable across process, voltage and temperature variation, a second oscillator comprising a scaled version of the inverters of the first oscillator, configured as a closed loop current controlled high frequency oscillator to generate the output frequency of the PLL, a frequency calibration block, configured to generate a frequency code by comparing a reference clock frequency and a feedback clock frequency, a digital to analog converter, configured to generate a second current by multiplying the first current and the frequency code, a voltage to current converter, configured to generate a third current by converting voltage output of the loop filter to current, wherein input current to the second oscillator is sum of the second current and the third current, wherein the frequency code is generated and stored during a training mode prior to the normal mode of the PLL, wherein the voltage output of the loop filter is clamped to a clamp voltage during the training mode.

* * * * *